(12) United States Patent
Abramovici et al.

(10) Patent No.: US 6,966,020 B1
(45) Date of Patent: Nov. 15, 2005

(54) IDENTIFYING FAULTY PROGRAMMABLE INTERCONNECT RESOURCES OF FIELD PROGRAMMABLE GATE ARRAYS

(75) Inventors: Miron Abramovici, Berkeley Heights, NJ (US); Charles E. Stroud, Charlotte, NC (US)

(73) Assignees: Agere Systems Inc., Allentown, PA (US); University of North Carolina at Charlotte, Charlotte, NC (US)

( * ) Notice: Subject to any disclaimer, the term of this patent is extended or adjusted under 35 U.S.C. 154(b) by 470 days.

(21) Appl. No.: 09/994,299

(22) Filed: Nov. 26, 2001

Related U.S. Application Data

(60) Provisional application No. 60/302,903, filed on Jul. 3, 2001.

(51) Int. Cl.[7] .............................................. G01R 31/28
(52) U.S. Cl. ....................... 714/725; 714/733; 714/738
(58) Field of Search ............................ 714/3, 725, 724, 714/733, 738, 742

(56) References Cited

U.S. PATENT DOCUMENTS

| | | | | |
|---|---|---|---|---|
| 5,790,771 | A | * | 8/1998 | Culbertson et al. ............. 714/3 |
| 5,887,002 | A | * | 3/1999 | Cooke et al. ................ 714/725 |
| 6,202,182 | B1 | * | 3/2001 | Abramovici et al. ........ 714/725 |
| 6,550,030 | B1 | * | 4/2003 | Abramovici et al. ........ 714/725 |
| 6,574,761 | B1 | * | 6/2003 | Abramovici et al. ........ 714/725 |
| 6,631,487 | B1 | * | 10/2003 | Abramovici et al. ........ 714/725 |

OTHER PUBLICATIONS

C. Stroud, S. Wijesuriya, C. Hamilton, And M. Abramovici, "Built-In Self-Test of FPGA Interconnect," Proc. Intn'l. Test Conf., pp. 404-411, 1998.

I. Harris and R. Tessier, "Interconnect Testing in Cluster-Based FPGA Architectures", Proc. AMC/IEEE Design Automation Conf., 2000.

I. Harris and R. Tessier, "Diagnosis of Interconnect Faults in Cluster-Based FPGA Architectures", Proc. IEEE Intn'l Conf. on Computer Aided Design, 2000.

M. Abramovici, et al., "Using Roving STARs for On-Line Testing and Diagnosis of FPGAs in Fault-Tolerant Applications," Proc. IEEE Intn'l. Test Conf., pp. 973-982, 1999.

M. Abramovici, et al., "Improving On-Line BIST-Based Diagnosis for Roving STARs," Proc. IEEE Intn'l On-Line Testing Workshop, 2000.

K. Roy and S. Nag, "On Routability for FPGAs Under Faulty Conditions," IEEE Trans on Computers, vol. 44, pp. 1296-1305, 1995.

(Continued)

*Primary Examiner*—David Ton
(74) *Attorney, Agent, or Firm*—King & Schickli, PLLC

(57) ABSTRACT

A method of identifying faulty programmable interconnect resources of a field programmable gate array (FPGA) may be carried out during manufacturing testing and/or during normal on-line operation. The FPGA resources are configured into a working area and a self-testing area. The working area maintains normal operation of the FPGA throughout on-line testing. Within the self-testing area, programmable interconnect resources of the FPGA are grouped and comparatively tested for faults. Upon the detection of one or more faults within a group of programmable interconnect resources, the group of resources is subdivided for further comparative testing in order to minimize a region of the group of resources including the fault for each fault. Once the region of the group of resources which includes the fault is minimized, the wires within the minimized region are comparatively tested in order to determine which wire includes the faulty resource or resources. Once the wire which includes the faulty resource is determined, a variety of testing configurations may be utilized to identify the faulty resource within the wire.

20 Claims, 4 Drawing Sheets

OTHER PUBLICATIONS

A. Steininger and Scherrer, "On the Necessity of On-Line BIST in Safety Critical Applications," Proc. 29th Fault-Tolerant Computing Symp, pp. 208-215, 1999.

M. Renovell, J. Portal, J. Figueras, and Y. Zorian, "Testing the Interconnect of RAM-Based FPGA," Proc. IEEE Design & Test of Computers, vol. 15, No. 1, pp. 45-50, 1998.

S. Dutt and F. Hancheck, "REMOD: A New Methodology for Designing Fault-Tolerant Arithmetic Circuits," IEEE Trans. on VLSI Systems, vol. 5, pp. 34-56, 1997.

S. Dutt, et al., "Efficient Incremental Rerouting for Fault Reconfiguration in Field Programmable Gate Arrays," ACM/IEEE Intn'l Conf. on Computer Aided Design, 1999.

J. Emmert and D. Bhatia, "Reconfiguring FPGA Mapped Designs with Applications to Fault Tolerance and Reconfigurable Computing", Lecture Notes on Comp. Sci., vol. 1304, pp. 141-150, 1997.

J. Emmert and D. Bhatia, "A Fault Tolerant Technique for FPGAs", Journal of Electronic Testing, vol. 16, pp. 591-606, 2000.

F. Hanchek and S. Dutt, "Methodologies for Tolerating Logic and Interconnect Faults in FPGAs," IEEE Trans. on Computers, pp. 15-33, 1998.

J. Lach, et al., "Low Overhead Fault-Tolerant FPGA Systems," IEEE Trans. on VLSI Systems, vol. 6, No. 2, pp. 212-221, 1998.

J. Lach, et al., "Algorithms for Efficient Runtime Fault Recovery on Diverse FPGA Architectures," Proc. Intn'l. Symp. on Defect and Fault Tolerance In VLSI Systems, 1999.

N. Mahapatra and S. Dutt, "Efficient Network Flow Based Technique for Dynamic Fault Reconfiguration in FPGAs", Proc. Fault Tolerant Computing Symp., pp. 122-129, 1999.

C. Zeng, N. Saxena and E. McCluskey, "Finite State Machine Synthesis With Concurrent Error Detection", Proc. IEEE Int'l. Test Conf., 1999, pp. 672-6789.

F. Lombardi, D.Ashen, X. Chen, and W.K. Huang, "Diagnosing Programmable Interconnect Systems for FPGAs," Proc. ACM/SIGDA Intn'l. Symp. on FPGAs, pp. 100-106, 1996.

J. Emmert and D. Bhatia, "Incremental Routing in FPGAs", Proc. IEEE Int'l. ASIC Conf., pp. 302-305, 1998.

* cited by examiner

IDENTIFYING FAULTY PROGRAMMABLE INTERCONNECT RESOURCES OF FIELD PROGRAMMABLE GATE ARRAYS

This application claims the benefit of U.S. Provisional Application No. 60/302,903, filed Jul. 3, 2001.

This invention was made with Government support under contract number F33615-98-C-1318. The Government has certain rights in this invention.

TECHNICAL FIELD

The present invention relates generally to the field of integrated circuit devices and, more particularly, to a method of identifying faulty programmable interconnect resources of field programmable gate arrays.

BACKGROUND OF THE INVENTION

A field programmable gate array (FPGA) is a type of integrated circuit consisting of an array of programmable logic blocks interconnected by a programmable interconnect network and programmable input/output cells. Programming of the logic blocks, the interconnect resources which make up the network, and the input/output cells is selectively completed to make the necessary interconnections that establish one configuration thereof to provide the desired system operation/function for a particular application.

The present inventors have recently developed off-line methods of built-in self-testing the array of programmable logic blocks and the programmable interconnect resources in FPGAs at the device, board and system levels. These methods are set out in detail in U.S. Pat. Nos. 5,991,907, 6,003,150, 6,108,806, and 6,202,182. The full disclosures in these patents are incorporated herein by reference.

In addition to these off-line testing methods, the present inventors have also recently developed methods of testing and fault tolerant operation of the programmable logic blocks and methods of testing the programmable interconnect resources during normal on-line operation of the FPGAs. These testing and operating methods are set out in detail in U.S. Pat. Nos. 6,256,758, 6,550,030, 6,631,487, 6,474,761, and 6,530,049. The full disclosures in these patents are also incorporated herein by reference.

On-line testing and fault tolerant operation of FPGAs is most important in high-reliability and high-availability applications, such as, long-life space missions, telecommunication network routers, or remote equipment in which adaptive computing systems often rely on reconfigurable hardware to adapt system operation to environment changes. In such applications, the FPGA hardware must work continuously and simply cannot be taken off-line for testing, maintenance, or repair.

When faults are detected in the programmable interconnect resources of the FPGA hardware of these systems, the faulty resources must be quickly identified in order to facilitate efficient reconfiguration of the remaining FPGA resources to avoid the faulty resources, or to reuse the faulty resources for fault-tolerant operation of the FPGA. Accordingly, a need is identified for an efficient and adaptive method of identifying faulty programmable interconnect resources which may be performed concurrently with normal system operation or during manufacturing testing.

SUMMARY OF THE INVENTION

In accordance with the present invention, a method of identifying faulty programmable interconnect resources of a field programmable gate array (FPGA) may be carried out during normal on-line operation and/or during manufacturing testing. The FPGA resources are configured into a working area and a self-testing area. The working area maintains normal operation of the FPGA throughout on-line testing. During manufacturing testing, the working area may be replaced with additional self-testing areas or the self-testing area extended to include the entire FPGA. Within the self-testing area, the programmable interconnect resources are tested for faults and faulty interconnect resources identified. It is initially presumed that all of the resources of the FPGA are fault-free as determined through manufacturing testing.

To test the programmable interconnect resources, test patterns are generated and applied to programmable interconnect resources selected for testing. Outputs of a first group of selected programmable interconnect resources, or wires under test, are preferably compared to outputs of a second group of wires under test. Based on a comparison of the outputs of the groups of wires under test, fault status data is generated.

The first and second groups of wires under test may be further compared to at least a third group of wires under test. Based on a comparison of the outputs of the first group of wires under test with the third group, for example, the presence of the at least one faulty resource within either the first or second group of wires under test may be determined. Whether or not the fault is identified within the first group of wires under test through comparison to the third group of wires under test, the second group of wires under test may also be compared to the third, or a different group of wires under test, to determine whether multiple faults are present, i.e., to insure that the second group of wires under test are fault-free.

Once a group of wires under test containing a faulty programmable interconnect resource is identified, the FPGA resources within the self-testing area of the FPGA under test may be reconfigured into subsequent groups of wires under test for further testing in order to minimize a region of the group of wires under test which includes the faulty interconnect resource. Specifically, the group of wires under test which includes the faulty interconnect resource may be subdivided and its interconnect resources grouped with additional known fault-free resources to form the subsequent groups of wires under test. The subsequent groups of wires under test may be further comparatively tested in the manner described above. These steps of testing and reconfiguring may be repeated until the region of the group of wires under test which includes the faulty interconnect resource is minimized.

Depending upon which interconnect resources are being tested, an alternate method of testing the programmable interconnect resources with the faulty group of wires under test (or a combination of the two methods) may be utilized to minimize the region of the group of wires under test which includes the faulty resource. Specifically, the FPGA resources within the self-testing area may be configured such that comparisons of the output patterns of regions of the groups of wires under test may be made at several locations along the groups of wires under test and fault status data for each region may be produced. In this manner, the region of the group of wires under test containing the faulty interconnect resource may be minimized without subdividing the group of wires under test as described above.

Once a region of the groups of wires is identified as including the faulty resource in the alternate method, the direction of propagation of the test patterns along the groups of wires under test may be reversed allowing the identified region of the group of wires to be further reduced, or a determination made that multiple interconnect resources may be faulty. If there are multiple faulty resources, the group of wires under test may then be subdivided and tested as described above in order to separate the multiple faulty resources for further testing. Once separated, the FPGA resources within the self-testing area may be reconfigured into subsequent groups of wires under test for further testing in order to isolate regions of the groups of wires under test which include the faulty interconnect resources in the manner described above.

Once the region from the group of wires under test containing a faulty programmable interconnect resource is minimized, the FPGA resources within the self-testing area of the FPGA under test may be reconfigured into subsequent groups of wires under test for further testing in order to identify which wire within the minimized region of the group of wires under test includes the faulty interconnect resource. Specifically, the wires of the region of the group of wires under test which includes the faulty interconnect resource may be subdivided and grouped with additional known fault-free resources to form the subsequent groups of wires under test. The subsequent groups of wires under test are further comparatively tested in the manner described above. These steps of testing and reconfiguring may be repeated until the wire within the minimized region of the group of wires under test includes the faulty interconnect resource is identified.

In accordance with the broad teachings of the present invention, the steps of minimizing a region of the group of wires under test and identifying which wire in the group of wires under test includes the faulty interconnect resource may be conducted in any order. For example, once a group of wires under test containing a faulty programmable interconnect resource is identified, the FPGA resources within the self-testing area of the FPGA under test may be reconfigured into subsequent groups of wires under test for further testing in order to identify which wire in the group of wires under test includes the faulty interconnect resource in the manner described above. Once the wire of the group of wires under test is identified, a region of the identified wire which includes the faulty interconnect resource may be minimized in the manner described above.

Once the region of the group of wires under test which includes the faulty interconnect resource is minimized and the wire within the group of wires identified, the FPGA resources within the self-testing area are again reconfigured to test the interconnect resources, i.e., the wire segments and/or configurable interconnect points, within the minimized region of the identified wire in order to identify the faulty interconnect resource or combination of resources. Specifically, portions of the faulty region of the identified wire are re-routed using known fault-free wires and/or configurable interconnect points to avoid suspect faulty wire segments or configurable interconnect points and further tested. These steps of re-routing and testing may be repeated until the faulty wire and/or configurable interconnect point is identified.

In accordance with another aspect of the present invention, the self-testing area of the FPGA under test may be reconfigured so that a portion of the working area becomes a subsequent self-testing area, and at least a portion of the initial self-testing area becomes a portion of the working area once testing of the resources in the self-testing area of the FPGA under test is completed and any faulty interconnect resource identified. In other words, the self-testing area may rove around the FPGA under test repeating the steps of testing, reconfiguring, and identifying faulty interconnect resources within the self-testing areas while normal operation of the FPGA under test continues within the working areas uninterrupted by the activities conducted within the roving self-testing area.

An apparatus for identifying faulty programmable interconnect resources of an FPGA under test during normal on-line operation includes a test and reconfiguration controller in communication with the FPGA under test for: (a) configuring the field programmable gate array into a self-testing area and a working area, the working area maintaining normal operation of the field programmable gate array; (b) initiating testing of groups of programmable interconnect resources located within the self-testing area for faults; (c) reconfiguring groups of resources determined to include a faulty resource for further testing in order to minimize a region of the group of resources which includes the faulty resource; (d) repeating the steps of testing and reconfiguring until the region of the group of resources which include the faulty resource is minimized; (e) reconfiguring the resources located within the minimized faulty region of the group of resources for further testing in order to identify the faulty resource by re-routing portions of the minimized faulty region to avoid suspect resources; and (f) repeating the steps of reconfiguring and further testing until the faulty resource is identified. The testing apparatus further includes a storage device or medium in communication with the test and reconfiguration controller for storing a plurality of test configurations, and usage and fault status data for each FPGA resource.

BRIEF DESCRIPTION OF THE DRAWINGS

The accompanying drawings incorporated in and forming apart of the specification, illustrate several aspects of the present invention and together with the description serve to explain the principles of the invention. In the drawings.

Reference will now be made in detail to the present preferred embodiment of the invention, an example of which is illustrated in the accompanying drawings.

DETAILED DESCRIPTION OF THE INVENTION

A typical field programmable gate array (FPGA) generally consists of a plurality of resources including an array of programmable logic blocks (PLBs) interconnected by a programmable interconnect network, and programmable input/output cells or boundary scan ports (most FPGAs feature a boundary-scan mechanism). Such structures are, for example, featured in Agere Systems' ORCA Series FPGAs, in the Xilinx VIRTEX Series FPGAs, and in the Altera FLEX 8000 logic devices. In accordance with a preferred embodiment of the present inventive method, programmable interconnect resources which make up the interconnect network of an FPGA under test 10 are tested for faults and faulty interconnect resources identified in an efficient and adaptive manner during normal on-line operation of the FPGA under test 10.

Figure 1:
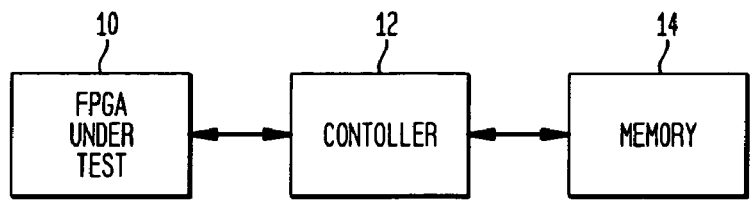
FIG. 1 is a schematic block diagram of an apparatus for testing resources of a field programmable gate array (FPGA)

As shown in schematic block diagram in FIG. 1, the present method of identifying faulty programmable interconnect resources is preferably controlled by a test and reconfiguration controller 12. Most preferably, an external test and reconfiguration controller 12 is utilized because present commercially available FPGAs do not provide internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to an FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

Figure 2:
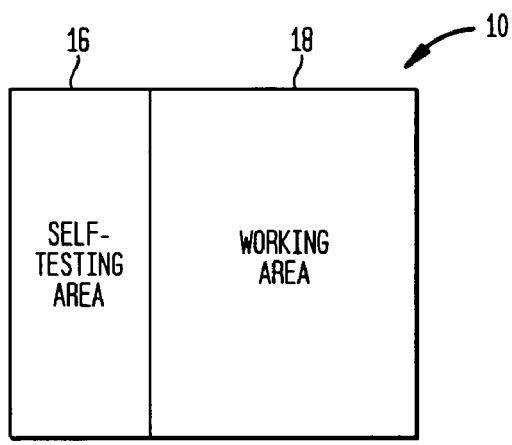
FIG. 2 is an illustration of an FPGA under test configured into a self-testing area and a working area which maintains normal operation of the FPGA under test.

The preferred controller 12 may be implemented on a microprocessor in communication with a storage medium or memory 14 for storing the various FPGA operational and test configurations, as well as, fault status data for the FPGA resources, or a standard piece of test equipment. In operation, the controller 12 accesses the FPGA under test 10 using its boundary-scan interface in a known manner such that access is transparent to normal function of the FPGA 10. Specifically, the controller 12 uses the boundary-scan interface to configure the FPGA resources for testing, to initiate testing of the FPGA resources, and to scan out the test results. As shown in FIG. 2, the FPGA under test 10 is initially configured by the controller 12 into a self-testing area 16 and a working area 18. In accordance with an important aspect of the present invention, normal operation of the FPGA under test 10 is maintained within the working area 18 while the programmable interconnect resources are tested and faulty resources identified in the self-testing area 16. During manufacturing testing, the working area may be replaced with additional self-testing areas or the self-testing area extended to include the entire FPGA.

Figure 3:
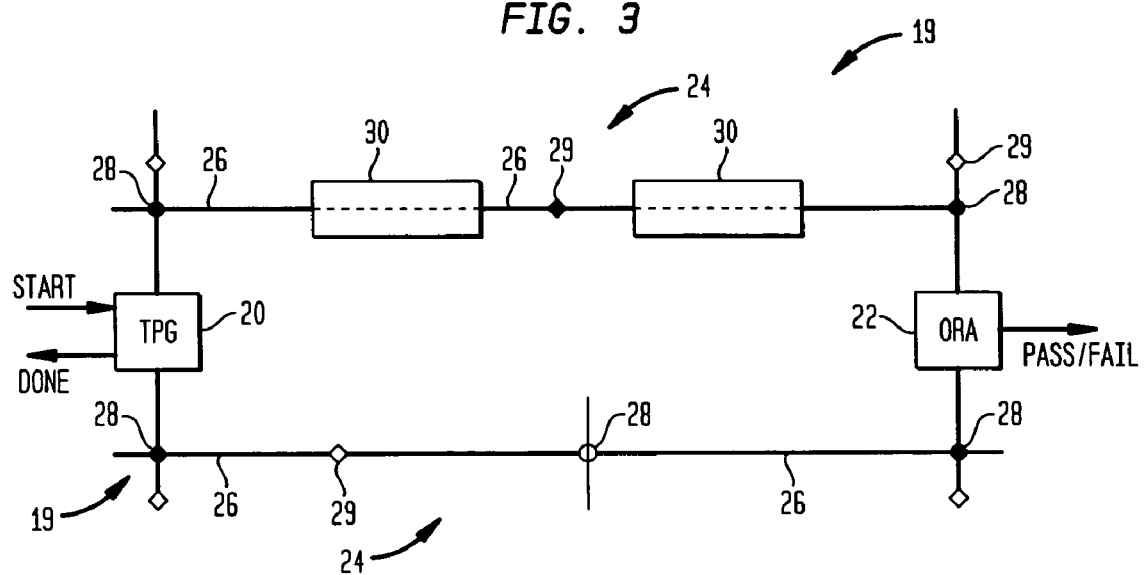
FIG. 3 is an illustration showing a preferred comparison-based tester configured to include a test pattern generator, an output response analyzer, and two groups of wires under test.

Testing of the FPGA 10 is generally accomplished by configuring its resources within the self-testing area 16 to function as a test pattern generator (TPG) 20 and an output response analyzer (ORA) 22, and as groups of interconnect resources or wires under test (WUTs) 24 as shown in FIG. 3. During testing, an exhaustive set of equivalent test patterns generated using the TPG 20 is applied to and propagated along the groups of WUTs 24. Most preferably, the TPG 20 utilized to generate the exhaustive set of test patterns is configured as an n-bit counter. The groups of WUTs 24 may include wire segments 26, configurable or configuration interconnect points (CIPs) (including cross point CIPs 28 for connecting wire segments located in disjoint planes and break-point CIPs 29 for connecting wire segments in the same plane), and programmable logic blocks (PLBs) 30. Preferably the groups of WUTs 24 initially extend along the length of the self-testing area 16.

Outputs of the groups of WUTs 24 are compared by the ORA 22 to determine whether a fault exists within either of the groups of WUTs 24. A match/mismatch result of the comparison performed by the ORA 22 is communicated as a pass/fail result or fault status data through the boundary-scan interface of the FPGA under test to the controller 12. The fault status data is stored in memory 14 and utilized by the controller 12 in reconfiguring the FPGA resources for further testing.

Figure 4:
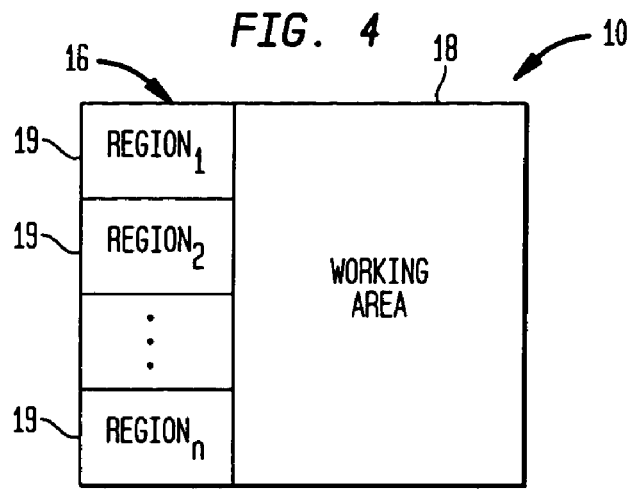
FIG. 4 is an illustration of an FPGA under test with an initial self-testing area divided into n testing regions.

In order to minimize the number of reconfigurations required during testing and therefore the total testing time, the FPGA resources within the self-testing area 16 are preferably configured to include several testing regions 19 (Region$_1$, Region$_2$, . . . . Region$_n$) as shown in FIG. 4. Necessarily each tester 19 includes at least a TPG 20, an ORA 22, and two groups of WUTs 24. Comparative testing of the interconnect resources within each tester 19 is conducted concurrently. The present preferred comparison-based on-line method of testing the programmable interconnect resources briefly described above including the fault model utilized and configuration of the self-testing area is described in detail for programmable interconnect resources in the above-referenced U.S. Pat. No. 6,574,761 and in C. Stroud ET AL., Built-In Self-Test of FPGA Interconnect, PROC. INTN'L TEST CONF., at 404–411, 1998 incorporated herein by reference. As indicated above, the present preferred method may target permanent faults that exist in a newly manufactured FPGA device or which appear during the lifetime of the FPGA under test.

Figure 5:
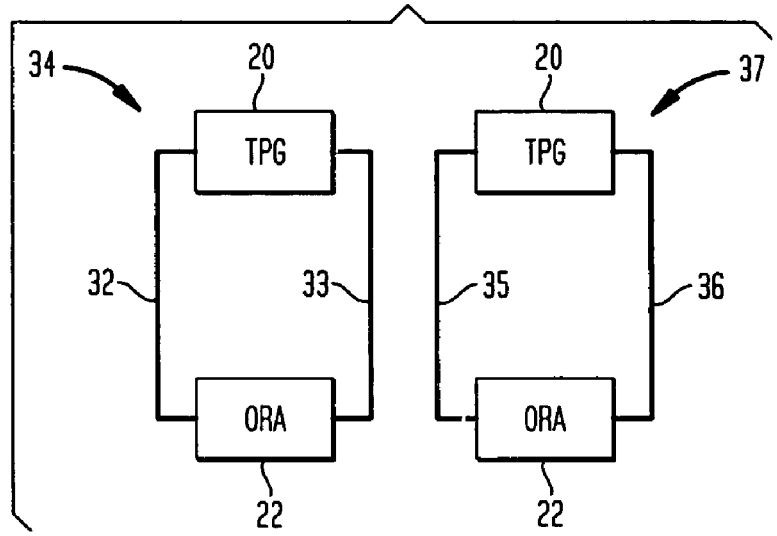
FIG. 5 is a schematic block diagram of two comparison based testing regions.

In order to avoid potential problems caused by equivalent faults in the groups of WUTs being compared in each tester, the test patterns propagated along a first group of WUTs 32 are preferably compared to test patterns propagated along two different groups of WUTs. As shown in FIG. 5, for example, the test patterns propagated along a first group of WUTs 32 are compared to the test patterns propagated along a second group of WUTs 33 in the same tester 34, and subsequently to test patterns propagated along a third group of WUTs 35 from a different tester 37. In addition, the test patterns propagated along the second group of WUTs 33 are similarly compared to test patterns propagated along a third group of WUTs from a different tester, such as the third group of WUTs 35 from the tester 37. Advantageously, these secondary comparisons substantially eliminate the potential problem of equivalent faults within the groups of WUTs and, in accordance with an important aspect of the present invention, provide an indication as to which of the first or second group of WUTs 32 or 33 within the tester 34, or both, contain the faulty interconnect resource or resources.

When the fault status data indicates the detection of a fault in one of the testing regions 19 in the self-testing area 16, roving of the self-testing area 16 is temporarily interrupted. In other words, the controller 12 stops or parks the self-testing area 16 over the testing region 19 suspected of containing the faulty interconnect resource. In this manner, the faulty interconnect resource may be identified while normal operation of the FPGA under test 10 continues in the working area 18.

Figure 6:
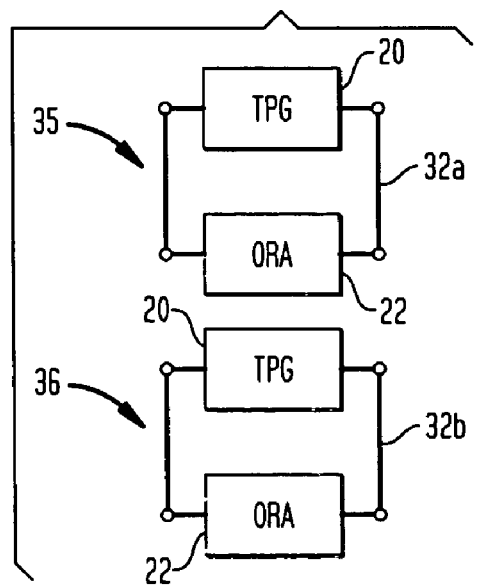
FIG. 6 is a schematic block diagram of two comparison based testing regions each including a subdivided portion of FPGA resources of a group of wires under test.

Once a group of WUTs 32 is identified as including a faulty programmable interconnect resource, the resources of the FPGA under test 10 within the self-testing area 16 are reconfigured for further testing in order to minimize a region of the group of WUTs 32 which includes the faulty interconnect resource. Preferably, the group of WUTs 32 containing the faulty resource is reconfigured into subsequent groups of WUTs 32*a* and 32*b* as shown in FIG. 6 for further comparative testing. The subsequent groups of WUTs 32*a*, 32*b* are further tested in order to minimize a region of the group of WUTs 32 which includes the faulty interconnect resource. Specifically, the suspect group of WUTs 32 is subdivided and its interconnect resources grouped with additional know fault-free resources to form the two subsequent groups of WUTs 32*a*, 32*b*. The programmable interconnect resources in each subsequent group of WUTs 32*a*, 32*b* are independently comparatively tested in new testing regions 35, 36 in the manner described above. Dependent upon the subsequent fault status data, the interconnect resources within one or both of the subsequent groups of WUTs 32*a*, 32*b* may be further reconfigured or subdivided, and tested until the region (or regions in the case of multiple faults) of the group of WUTs 32 which includes the faulty programmable interconnect resource is minimized. In other words, the steps of testing and reconfiguring may be repeated until the region of the group of WUTs 32 which includes the faulty interconnect resource cannot be further subdivided.

Figure 7:
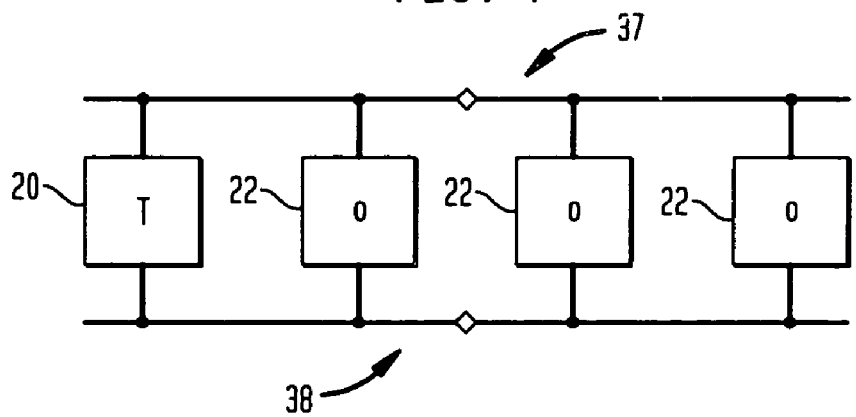
FIG. 7 is a schematic block diagram showing an alternate tester which includes a test pattern generator, groups of wires under test and several output response analyzers to accommodate parallel testing.

Depending upon which interconnect resources are being tested, an alternate method of testing the programmable interconnect resources within the faulty group of wires under test (or a combination of the two methods) may be utilized to minimize the region of the group of wires under test which includes the faulty resource. As shown in FIG. 7, the FPGA resources within the self-testing area 16 may be configured such that comparisons of the output patterns of regions of the groups of wires under test 37, 38 may be made by ORAs 22 at several locations along the groups of wires under test and fault status data for each region may be produced. In this manner, the region of the group of wires under test containing the faulty interconnect resource may be minimized without subdividing the group of wires under test as described above.

Once a region of the groups of wires is identified as including the faulty resource in the alternate method, the direction of propagation of the test patterns along the groups of wires under test 37, 38 may be reversed allowing the identified region of the group of wires to be further reduced, or a determination made that multiple interconnect resources may be faulty. If there are multiple faulty resources, the group of wires under test 37, 38 may then be subdivided and tested as described above in order to separate the multiple faulty resources for further testing. Once separated, the FPGA resources within the self-testing area 16 may be reconfigured into subsequent groups of wires under test for further testing in order to minimize regions of the groups of wires under test which include the faulty interconnect resources in the manner described above.

Figure 8:
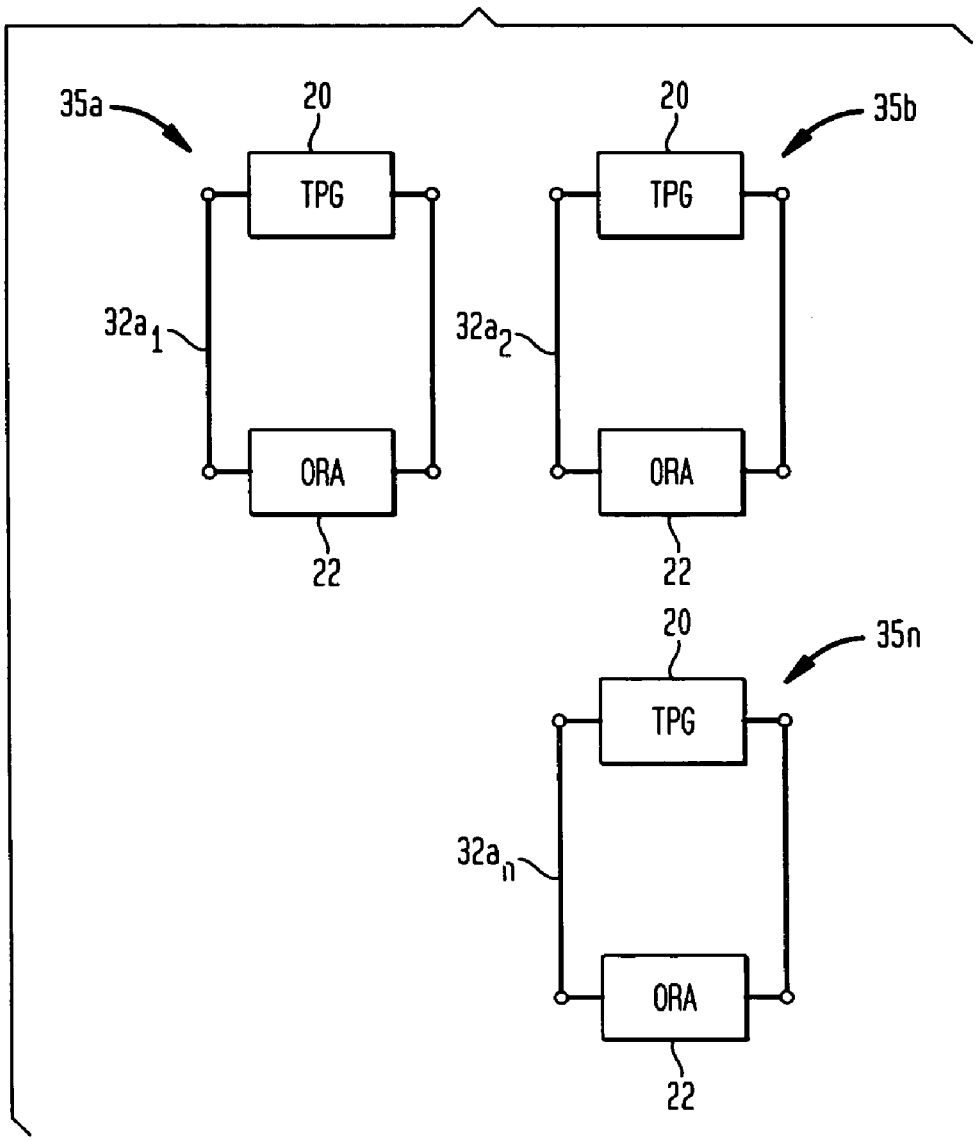
FIG. 8 is a schematic block diagram of n comparison based testing regions each including a wire of a group of wires under test which includes a faulty interconnect resource.

Once it becomes impractical to further subdivide the region of the group of WUTs 32 which includes the faulty interconnect resource, the resources of the FPGA under test 10 are again reconfigured in order to identify a wire $32a_1$, $32a_2, \ldots 32a_n$ of the minimized region of the group of WUTs 32*a*, for example, which includes the faulty interconnect resource. Specifically as shown in FIG. 8, the wires $32a_1, 32a_2, \ldots 32a_n$ of the suspect group of WUTs 32*a* are grouped with additional known fault-free resources to form two subsequent groups of WUTs which are comparatively tested in new testing regions 35*a*, 35*b*, . . . 35*n* in the manner described above. Dependent upon the subsequent fault status data, the wires $32a_1, 32a_2, \ldots 32a_n$ may be further reconfigured and tested until the wire of the minimized region of the group of WUTs 32*a* which includes the faulty programmable interconnect resource is identified. In other words, the steps of testing and reconfiguring may be repeated until the wire (e.g., $32a_1$) of the minimized region of the group of WUTs 32*a* which includes the faulty interconnect resource is identified.

In accordance with the broad teachings of the present invention, the steps of minimizing a region of the group of wires under test and identifying which wire in the group of wires under test includes the faulty interconnect resource may be performed in any order. For example, once a group of wires under test containing a faulty programmable interconnect resource is identified, the FPGA resources within the self-testing area of the FPGA under test may be reconfigured into subsequent groups of wires under test for further testing in order to identify which wire in the group of wires under test includes the faulty interconnect resource in the manner described above. Once the wire of the group of wires under test is identified, a region of the identified wire which includes the faulty interconnect resource may be minimized in the manner described above.

Once the region of the WUTs is minimized and the wire identified, a variety of testing configurations may be adaptively utilized to identify the faulty interconnect resource within the faulty region of the wire. In order to more precisely identify which interconnect resource, i.e., which wire segment or configuration interconnect point (CIP), within the faulty region is faulty, further reconfiguration and comparative testing is required.

Figure 9:
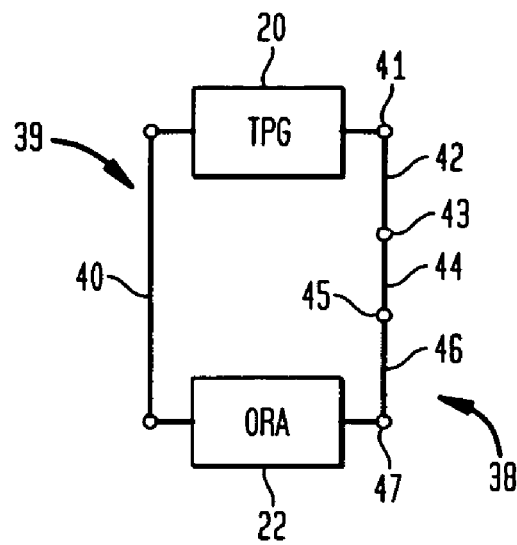
FIG. 9 is a schematic block diagram of a tester for comparing a minimized region of the group of wires under test to a known fault-free wire.

In accordance with the preferred embodiment of the present invention, the faulty region of the identified wire is compared to a second group of interconnect resources containing only known fault-free resources in the manner described above. As shown in FIG. 9, for example, the resources in the faulty region 38 may include wire segments 42, 44, and 46 and CIPs 41, 43, 45, and 47. The second group of interconnect resources 39 may include a single known fault-free wire 40 or a group or interconnect resources. In order to identify which interconnect resource within the faulty region 38 is faulty, additional known fault-free resources are combined with the resources in the faulty region 38 in order to circumvent one suspect resource at a time.

Figure 10:
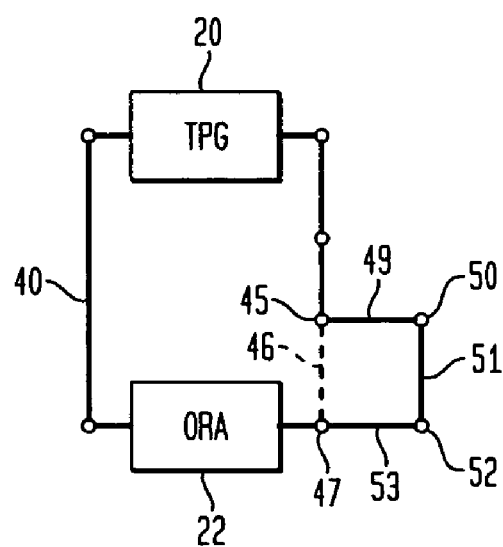
FIG. 10 is a schematic block diagram showing the tester in FIG. 9 wherein the minimized region of the group of wires under test is partially re-routed to avoid a wire in order to determine whether the wire is faulty.

As shown in FIG. 10, for example, the additional fault-free resources 49, 50, 51, 52, and 53 may be utilized to re-route the resources within the faulty region 38 to avoid a selected suspect resource (e.g., 46) one at a time during testing. In other words, the additional fault-free resources 49, 50, 51, 52, and 53 are utilized to re-route the resources within the faulty region 38 such that the suspected faulty resource, i.e., wire segment 46 is removed from the faulty region 38 during the comparative testing. The steps of re-routing and testing are repeated until each interconnect resource in the faulty region 38 is removed from the faulty region 38 during testing.

Although a preferred method for identifying faulty interconnect resources is broadly set out above, it must be appreciated that the steps utilized to identify a faulty interconnect resource within a faulty region depend both on the type of fault, e.g., an open, a short, etc., and the type of interconnect resources included in the faulty region. The following example is provided to better illustrate this point and the present invention.

Before providing the noted example, however, it must first be understood that the definition of a wire segment varies dependent upon the type of fault associated therewith. A wire segment for an open fault is defined as a wire bounded by any two CIPs (including cross-point and breakpoint CIPs) with no other CIPs in between. A wire segment for a short fault, on the other hand, is defined as a wire(s) bounded by breakpoint CIPs.

Figure 11:
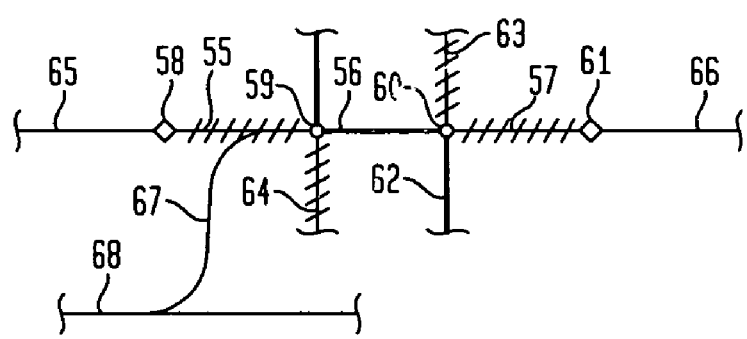
FIG. 11 is a schematic block diagram showing a group of interconnect resources used for explanation purposes.

Referring to FIG. 11, for example, wire segments are represented by numerals 55, 56, and 57 when the fault is an open fault. Wire segment 55 is bound by a breakpoint CIP 58 and a cross-point CIP 59, wire segment 56 is bound by cross-point CIPs 59 and 60, and wire segment 57 is bound by cross-point CIP 60 and breakpoint CIP 61. The reason for this definition is that an open in any of these wire segments 55, 56, or 57 can be uniquely identified using the above-described re-routing steps. For example, assume that the bold solid line (or signal net) routed through cross-point CIP 59, wire segment 56, and cross-point CIP 60 represents a group of WUTs 62 in an FPGA under test. This group of WUTs may be used to test wire segment 56 for an open fault even though wire segments 55, 57, 63, and 64 are connected to the same signal net 62 through cross-point CIPs 59 and 60 respectively. These wire segments 55, 57, 63, and 64 connect the group of WUTs 62 to other wire segments in the interconnect network due to the function of the cross-point CIPs 59 and 60 which does not break continuity along horizontal and vertical wires like breakpoint CIPs. Similarly, wire segments 55 and 57 may be tested for an open fault by reconfiguring the interconnect resources and more specifically creating new groups of WUTs which include wire segments 65, 55, and 64 and 63, 57 and 66, respectively.

Further reconfigurations and testing may be utilized to identify the faulty interconnect resource, i.e., whether the open fault is in a wire segment or an adjacent CIP, in some scenarios depending upon where the open fault actually resides. If the open fault is in wire segment 56 which is positioned between two cross-point CIPs 59 and 60, for example (shown in FIG. 11), further reconfiguration(s) and testing may identify that the CIPs are in working order and that the open fault resides in the wire segment 56. If the open fault resides in one of the CIPs 59 or 60 as a stuck-open fault, then a determination of whether the open fault resides in the wire segment 56 or an adjacent CIP 59 or 60 cannot be made. Nevertheless, an open wire segment 56 and an adjacent stuck-open cross-point CIP 59 or 60 are equivalent faults making such a determination unnecessary. Similarly, if the fault status data indicates that the open fault is in wire segment 55 which is positioned between a breakpoint CIP 58 and a cross-point CIP 59 then a determination of whether the open fault resides in the wire segment 55 or adjacent breakpoint CIP 58 cannot be made. Again, however, an open wire segment 55 and an adjacent stuck open breakpoint CIP 58 are equivalent faults making such a determination unnecessary.

As indicated above, a wire segment for a short fault is defined to include a group of wire segments bounded by breakpoint CIPs. As shown in FIG. 11, the wire segment for a short fault includes wires 55, 56, and 57. This is because a short fault, such as short 67, between wires 55 and 68 affect wire segments 55, 56, and 57 which must therefore be treated as a single faulty segment. This is due in part to the fact that further reconfigurations and testing are generally ineffective to identify the faulty interconnect resource, i.e., whether the short is in a wire or a CIP. For example, when the fault status data indicates a short between two wires connected by a CIP, a determination as to whether a short fault between the wires exists or whether the CIP is stuck-closed cannot be made. Shorted wires which are not connected by a CIP, such as wires 55 and 68 in FIG. 11 however, can be further diagnosed by seeing that each wire is fully functional while the other segment it is shorted to is unused. When both segments are being tested then the failure is visible and testing can determine that the fault is a short between these segments.

Upon the completion of testing of at least the interconnect resources of the FPGA within the initial self-testing area 16 and identifying the faulty interconnect resource(s), the FPGA under test 10 is reconfigured such that the functions of the PLBs forming a portion of the working area 18 are copied to the PLBs forming the initial self-testing area 16 and the programmable interconnect resources appropriately re-routed. Once completed, the copied portion of the working area becomes a subsequent self-testing area. Preferably, the initial self-testing area 16 is reconfigured as an adjacent portion of the working area, i.e., the programmed function of an adjacent portion of the working area is relocated or more specifically, copied to the initial self-testing area 16, and the adjacent portion of the working area is reconfigured as the subsequent self-testing area. The present preferred method of roving the self-testing area 16 and reconfiguring the FPGA under test 10 is described in detail in the above-referenced U.S. application Ser. No. 09/405,958 and in M. ABRAMOVICI ET AL., Using Roving STARs for On-Line Testing and Diagnosis of FPGAs in Fault-Tolerant Applications, PROC. INTN'L TEST CONF., pp. 973–982, 1999 incorporated herein by reference.

In accordance with the present inventive method, the programmable interconnect resources of subsequent self-testing areas are similarly tested and faulty resources identified, if required, as described above for the initial self-testing area 16 until each portion of the FPGA under test 10 is reconfigured as a subsequent self-testing area and at least its interconnect resources tested. In other words, the self-testing area may continuously rove around the FPGA under test 10 repeating the steps of configuring, testing, and identifying so long as the FPGA under test 10 is in operation. Advantageously, normal operation of the FPGA under test 10 continues uninterrupted by the testing conducted within the self-testing areas.

In summary, the method of identifying faulty programmable routing resources in field programmable gate arrays may be carried out during normal on-line operation of an FPGA under test and/or during manufacturing testing by configuring FPGA resources into a working area and a self-testing area. The working area maintains normal operation of the FPGA throughout testing. During manufacturing testing, the working area may be replaced with additional self-testing areas or the self-testing area extended to include the entire FPGA. Within the initial and subsequent self-testing areas, however, the FPGA interconnect resources are reconfigured as testing regions which include groups of wires under test. The groups of wires under test are comparatively tested to determine whether a fault exists within either of the groups of wires under test. The FPGA resources within the group of wires under test identified to include a faulty interconnect resource are reconfigured, or subdivided, into subsequent groups of wires under test for further testing in order to minimize a region of the group of wires under test which includes the faulty resource and to identify a wire within the minimized region which includes the faulty resource. The FPGA resources within the self-testing area are again reconfigured to test the interconnect resources, i.e., the wire segments and/or configurable interconnect points, within the minimized region of the identified wire in order to identify the faulty interconnect resource(s). Specifically, portions of the faulty region of the identified wire are re-routed using known fault-free wires, wire segments, and/or configurable interconnect points to avoid suspect faulty wire segments or configurable interconnect points and further tested. These steps of re-routing and testing are repeated until the faulty wire segment, configurable interconnect point, and/or combination thereof is identified. Advantageously, the working area is substantially unaffected by testing, and testing time constraints are reduced since normal operation continues in the working area.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of identifying faulty programmable interconnect resources of a field programmable gate array during normal on-line operation comprising the steps of:
   configuring said field programmable gate array into an initial self-testing area and a working area, said working area maintaining normal operation of the field programmable gate array;
   testing at least two groups of wires under test located within said self-testing area for faults;
   identifying a faulty group of wires under test from said at least two groups of wires under test having a faulty programmable interconnect resource therein;
   minimizing a region of said faulty group of wires under test containing said faulty programmable interconnect resource;
   identifying a wire within said faulty group of wires under test containing said faulty programmable interconnect resource;
   replacing programmable interconnect resources within said wire and said region with fault-free programmable interconnect resources for further testing in order to identify a wire segment, a configuration interconnect point, and/or a combination thereof which includes said fault.

2. The method set forth in claim 1, wherein the step of minimizing a region of said faulty group of wires under test containing said faulty programmable interconnect resource includes establishing said programmable interconnect resources located within said initial self-testing area as at least two subsequent groups of wires under test, at least one of said subsequent groups including a subdivided portion of said programmable interconnect resources located within said faulty group of wires under test; and
   testing said at least two subsequent groups of wires under test for faults in order to determine which subsequent group of wires under test includes said faulty programmable interconnect resource.

3. The method set forth in claim 2, wherein the steps of establishing and testing are repeated until the region of said faulty group of wires under test which includes said faulty resource is minimized.

4. The method set forth in claim 3, wherein the step of identifying a wire within said faulty group of wires under test containing said faulty programmable interconnect resource includes establishing said programmable interconnect resources located within said initial self-testing area as at least two wires under test, at least one of said wires including a subdivided portion of said minimized region of said faulty group of wires under test; and
   testing said at least two wires under test for faults in order to determine which wire under test includes said faulty programmable interconnect resource.

5. The method set forth in claim 4, wherein the steps of establishing and testing are repeated until the wire of said minimized region of said faulty group of wires under test which includes said faulty resource is identified.

6. The method set forth in claim 5, wherein the step of replacing programmable interconnect resources within said wire of said minimized region of said faulty group of wires under test to avoid suspect resources includes reconfiguring said programmable interconnect resources located within said initial self-testing area to avoid suspect faulty wire segments and configuration interconnect points; and
   testing said reconfigured wire of said minimized region of said faulty group of wires under test in order to identify a wire segment, a configuration interconnect point, and/or a combination thereof which includes said fault.

7. The method set forth in claim 6, wherein the steps of reconfiguring and testing are repeated until the faulty programmable interconnect resource of said wire of said minimized region of said faulty group of wires under test is identified.

8. The method set forth in claim 7 further comprising the step of roving said initial self-testing area by reconfiguring said field programmable gate array such that a portion of said working area becomes a subsequent self-testing area and at least a portion of said initial self-testing area becomes a portion of said working area.

9. The method set forth in claim 8, wherein the step of identifying a faulty group of wires under test from said at least two groups of wires under test includes propagating test patterns along at least two groups of wires under test;
   comparing outputs of said at least two groups of wires under test; and
   producing fault status data for said at least two groups of wires under test.

10. The method set forth in claim 1, wherein the step of identifying a wire within said faulty group of wires under test containing said faulty programmable interconnect resource includes establishing said programmable interconnect resources located within said initial self-testing area as at least two wires under test, at least one of said wires including a subdivided portion of said faulty group of wires under test; and testing said at least two wires under test for faults in order to determine which wire under test includes said faulty programmable interconnect resource.

11. The method set forth in claim 10, wherein the steps of establishing and testing are repeated until the wire of said faulty group of wires under test which includes said faulty resource is identified.

12. The method set forth in claim 11, wherein the step of minimizing a region of said faulty group of wires under test containing said faulty programmable interconnect resource includes establishing said programmable interconnect resources located within said initial self-testing area as at least two subsequent wires under test, at least one of said subsequent wires under test including a subdivided portion of said programmable interconnect resources located within said faulty wire under test; and testing said at least two subsequent wires under test for faults in order to determine which subsequent wire under test includes said faulty programmable interconnect resource.

13. The method set forth in claim 12, wherein the steps of establishing and testing are repeated until the region of said faulty wire under test which includes said faulty resource is minimized.

14. The method set forth in claim 13, wherein the step of replacing programmable interconnect resources within said wire of said minimized region of said faulty group of wires under test to avoid suspect resources includes reconfiguring said programmable interconnect resources located within said initial self-testing area to avoid suspect faulty wire segments and configuration interconnect points; and testing said reconfigured wire of said minimized region of said faulty group of wires under test in order to identify a wire segment, a configuration interconnect point, and/or a combination thereof which includes said fault.

15. The method set forth in claim 14, wherein the steps of reconfiguring and testing are repeated until the faulty programmable interconnect resource of said wire of said minimized region of said faulty group of wires under test is identified.

16. The method set forth in claim 15 further comprising the step of roving said initial self-testing area by reconfiguring said field programmable gate array such that a portion of said working area becomes a subsequent self-testing area and at least a portion of said initial self-testing area becomes a portion of said working area.

17. The method set forth in claim 16, wherein the step of identifying a faulty group of wires under test from said at least two groups of wires under test includes propagating test patterns along at least two groups of wires under test;

comparing outputs of said at least two groups of wires under test; and producing fault status data for said at least two groups of wires under test.

18. An apparatus for identifying faulty programmable interconnect resources of a field programmable gate array comprising:

a controller in communication with the field programmable gate array for: (a) configuring the field programmable gate array into a self-testing area and a working area, the working area maintaining normal operation of the field programmable gate array; (b) initiating testing of at least two groups of wires under test located within said self-testing area for faults; (c) identifying a faulty group of wires under test from said at least two groups of wires under test having a faulty programmable interconnect resource therein; (d) minimizing a region of said faulty group of wires under test containing said faulty programmable interconnect resource; (e) identifying a wire within said faulty group of wires under test containing said faulty programmable interconnect resource; and (f) replacing programmable interconnect resources within said wire and said region with fault-free programmable interconnect resources for further testing in order to identify a wire segment, a configuration interconnect point, and/or a combination thereof which includes said fault.

19. The apparatus for identifying faulty programmable interconnect resources of a field programmable gate array of claim 18, further comprising a storage medium in communication with said controller for storing a functional configuration of the field programmable gate array, a plurality of test configurations, and fault status data.

20. The apparatus for identifying faulty programmable interconnect resources of a field programmable gate array of claim 19, wherein said self-testing area roves by reconfiguring the field programmable gate array such that a portion of the working area becomes a subsequent self-testing area and at least a portion of the initial self-testing area becomes a portion of the working area.

* * * * *